US010930525B2

(12) United States Patent
Kwon et al.

(10) Patent No.: US 10,930,525 B2
(45) Date of Patent: Feb. 23, 2021

(54) CARRIER SUBSTRATE AND METHOD OF MANUFACTURING SEMICONDUCTOR PACKAGE USING THE CARRIER SUBSTRATE

(71) Applicant: SAMSUNG ELECTRONICS CO., LTD., Suwon-si (KR)

(72) Inventors: Yieok Kwon, Suwon-si (KR); Ikjun Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/665,745

(22) Filed: Oct. 28, 2019

(65) Prior Publication Data

US 2020/0152484 A1 May 14, 2020

(30) Foreign Application Priority Data

Nov. 8, 2018 (KR) .......................... 10-2018-0136703

(51) Int. Cl.
*H01L 21/56* (2006.01)
*H01L 21/48* (2006.01)
*H01L 21/683* (2006.01)
*H01L 23/498* (2006.01)

(52) U.S. Cl.
CPC ........ *H01L 21/568* (2013.01); *H01L 21/4857* (2013.01); *H01L 21/561* (2013.01); *H01L 21/6835* (2013.01); *H01L 23/49822* (2013.01); *H01L 23/49894* (2013.01); *H01L 2221/68359* (2013.01)

(58) Field of Classification Search
CPC . H01L 21/568; H01L 21/561; H01L 21/4857; H01L 21/6835; H01L 23/49894; H01L 2221/68359; H01L 23/49822; H01L 2221/68345; H01L 2224/02331; H01L 2224/02381
See application file for complete search history.

(56) References Cited

U.S. PATENT DOCUMENTS

| | | | |
|---|---|---|---|
| 7,902,660 B1 * | 3/2011 | Lee ........................ | H01L 23/498 257/698 |
| 8,497,163 B2 * | 7/2013 | Saito ...................... | H01L 21/561 438/118 |
| 8,871,609 B2 | 10/2014 | Yu et al. | |
| 9,997,441 B2 * | 6/2018 | Suzuki .............. | H01L 23/49827 |
| 10,103,106 B2 * | 10/2018 | Dang .................... | H01L 23/552 |
| 10,177,130 B2 * | 1/2019 | Lin ....................... | H01L 21/568 |
| 10,204,889 B2 * | 2/2019 | Lin .................... | H01L 21/76883 |
| 10,332,775 B2 * | 6/2019 | Rusli ................. | H01L 23/49827 |
| 10,347,574 B2 * | 7/2019 | Jeng ....................... | H01L 25/105 |
| 10,410,993 B2 * | 9/2019 | Ko ........................ | H01L 21/563 |

(Continued)

FOREIGN PATENT DOCUMENTS

KR 10-1119380 B1 3/2012

*Primary Examiner* — Bac H Au
(74) *Attorney, Agent, or Firm* — Sughrue Mion, PLLC

(57) ABSTRACT

A carrier substrate includes a core layer and at least one unit pattern portion, and the unit pattern portion includes a first metal layer disposed on the core layer, a release layer disposed on the first metal layer, a second metal layer disposed on the release layer, and a third metal layer disposed on the second metal layer and covering side surfaces of the release layer, and a method of manufacturing a semiconductor package using the carrier substrate.

15 Claims, 14 Drawing Sheets

(56) References Cited

U.S. PATENT DOCUMENTS

| | | | |
|---|---|---|---|
| 10,438,884 B2* | 10/2019 | Lee | H01L 23/49822 |
| 10,438,885 B1* | 10/2019 | Lu | H01L 21/481 |
| 10,468,339 B2* | 11/2019 | Tsai | H01L 25/50 |
| 10,777,876 B2* | 9/2020 | Lin | H01L 24/81 |
| 10,790,224 B2* | 9/2020 | Lee | H01L 21/56 |
| 2011/0155443 A1* | 6/2011 | Maeda | H01L 23/49822 |
| | | | 174/267 |
| 2017/0374748 A1* | 12/2017 | Yang | H01L 21/4846 |
| 2018/0102313 A1* | 4/2018 | Shih | H01L 24/19 |
| 2018/0114702 A1* | 4/2018 | Kodani | H01L 23/49822 |
| 2019/0067001 A1* | 2/2019 | Chen | H01L 21/6835 |
| 2019/0148276 A1* | 5/2019 | Chen | H01L 24/81 |
| | | | 257/774 |
| 2019/0295972 A1* | 9/2019 | Tsai | H01Q 1/2283 |
| 2019/0366690 A1* | 12/2019 | Jin | H05K 1/09 |
| 2020/0135673 A1* | 4/2020 | Kuo | H01L 21/31058 |

\* cited by examiner

CARRIER SUBSTRATE AND METHOD OF MANUFACTURING SEMICONDUCTOR PACKAGE USING THE CARRIER SUBSTRATE

CROSS-REFERENCE TO RELATED APPLICATION(S)

This application claims benefit of priority to Korean Patent Application No. 10-2018-0136703 filed on Nov. 8, 2018 in the Korean Intellectual Property Office, the disclosure of which is incorporated herein by reference in its entirety.

BACKGROUND

The present disclosure relates to a semiconductor package including an organic interposer.

As a set has been designed to have high specifications and a high bandwidth memory (HBM), the interposer market has grown. Generally, silicon has been used as a material of an interposer, but a glass interposer or an organic interposer has been developed to have a large area and to reduce costs.

To respond to a recent fine pad pitch of several tens micrometers, it has been required to micronize fine circuit lines of a die-to-die to several micrometers, and to this end, a carrier with flatness secured therein may be required.

Also, in the case of a process of manufacturing a semiconductor package including an interposer using a carrier, an interposer is formed to have panel size, and the process continues in quad size to improve quality of the package process. However, the carrier could be separated during sawing the panel in quad size. To address the issue, a design which can prevent separation may be required.

SUMMARY

An aspect of the present disclosure is to provide a carrier substrate based on a separation preventing design, and a method of manufacturing a semiconductor package using the carrier substrate, which may address the issue of abnormal detachment of a release layer from a carrier substrate during a process.

According to an aspect of the present disclosure, a carrier substrate includes a core layer, and at least one unit pattern portion, and the unit pattern portion includes a first metal layer disposed on the core layer, a release layer disposed on the first metal layer, and a third metal layer disposed on the release layer and covering side surfaces of the release layer.

The carrier substrate may include a base metal layer disposed between the core layer and the unit pattern portion, and having an area larger than an area of the unit pattern portion on the core layer.

The base metal layer may include a Ti component.
The first metal layer may include a Cu component.
The third metal layer may include a Cu component.
The first metal layer and the release layer may have the same width.

A region of the third metal layer covering the side surfaces of the release layer may be in contact with side surfaces of the first metal layer.

The release layer may be sealed by the first and third metal layers.

The carrier substrate may further include a second metal layer disposed on the release layer such that the release film is disposed between the first metal layer and the second metal layer.

The second metal layer may include a Ti component. The first metal layer, the release layer, and the second metal layer may have the same width.

Side surfaces of the second metal layer may be covered by the third metal layer.

A region of the third metal layer covering the side surfaces of the release layer and side surfaces of the second metal layer may be in contact with side surfaces of the first metal layer.

The release layer and the second metal layer may be sealed by the first and third metal layers.

The core layer may be a glass plate.

According to an aspect of the present disclosure, a method of manufacturing a semiconductor package includes preparing a carrier substrate, the carrier substrate including a core layer and at least one unit pattern portion disposed on the core layer, where the unit pattern portion includes a first metal layer disposed on the core layer, a release layer disposed on the first metal layer, a second metal layer disposed on the release layer, and a third metal layer disposed on the second metal layer and covering side surfaces of the release layer, forming an interposer on each of the unit pattern portions, cutting the carrier substrate and the interposer such that the unit pattern portions are isolated from each other, disposing a plurality of semiconductor chips on the interposer on each of the isolated unit pattern portions, forming an encapsulant encapsulating the plurality of semiconductor chips on the interposer on each of the isolated unit pattern portions, and manufacturing a plurality of semiconductor packages including an interposer portion, one or more semiconductor chips disposed on the interposer portion, and an encapsulant portion encapsulating the one or more semiconductor chips on each of the isolated unit pattern portions, trimming each of the isolated unit pattern portions such that the plurality of semiconductor packages on each of the isolated unit pattern portions are isolated from each other, and separating the carrier substrate from each of the isolated semiconductor packages.

The method may further include removing the isolated and trimmed unit pattern portions remaining in each of the semiconductor packages by an etching process, after the separating the carrier substrate.

The interposer may include redistribution layers and vias connecting the redistribution layers, respectively, and each of the vias may be tapered in a direction from the releasing layer to the carrier substrate.

The release layer may be sealed by the first and third metal layers.

The unit pattern portion may further include a second metal layer disposed on the release layer such that the release film is disposed between the first metal layer and the second metal layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
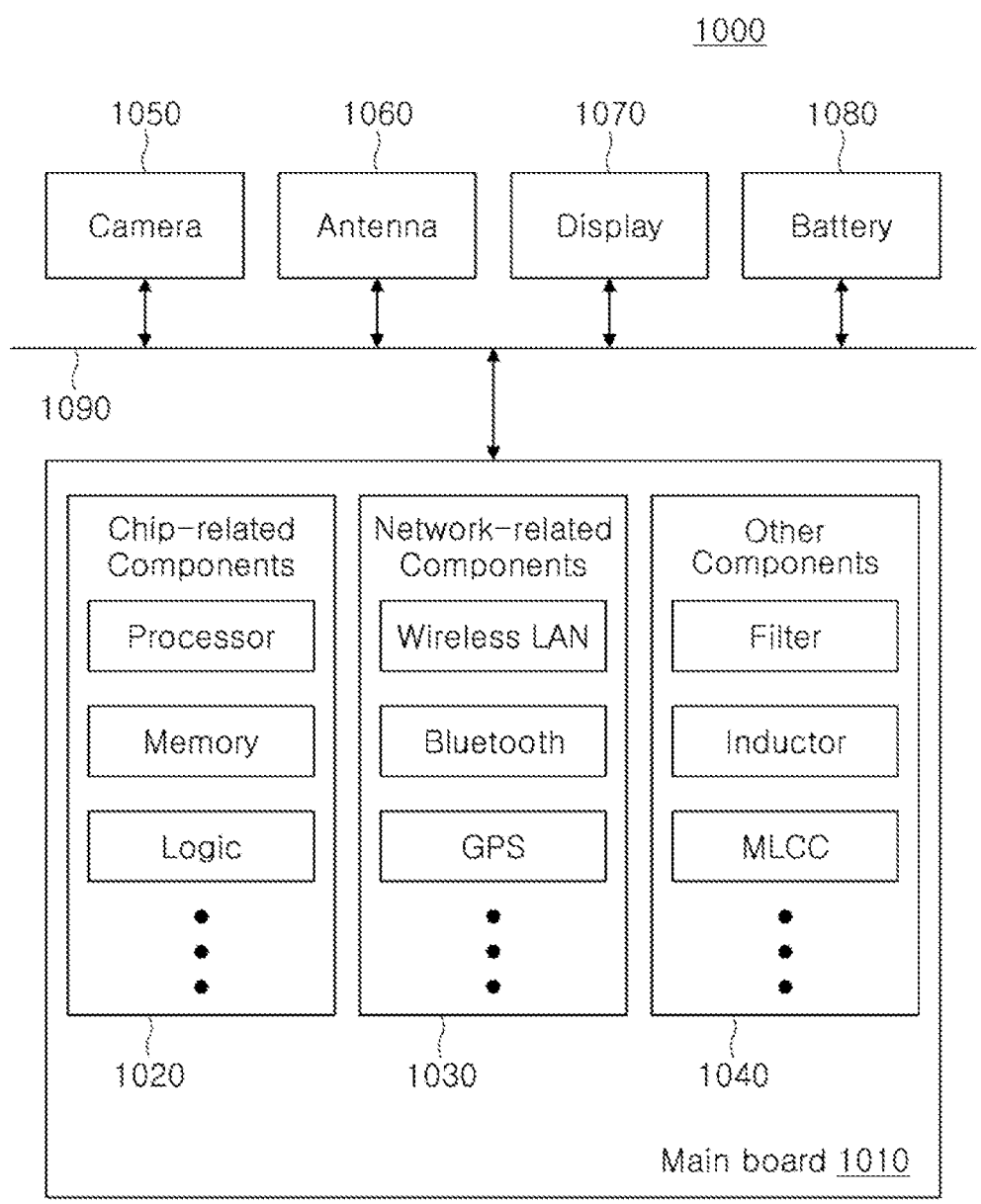
FIG. 1 is a schematic block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
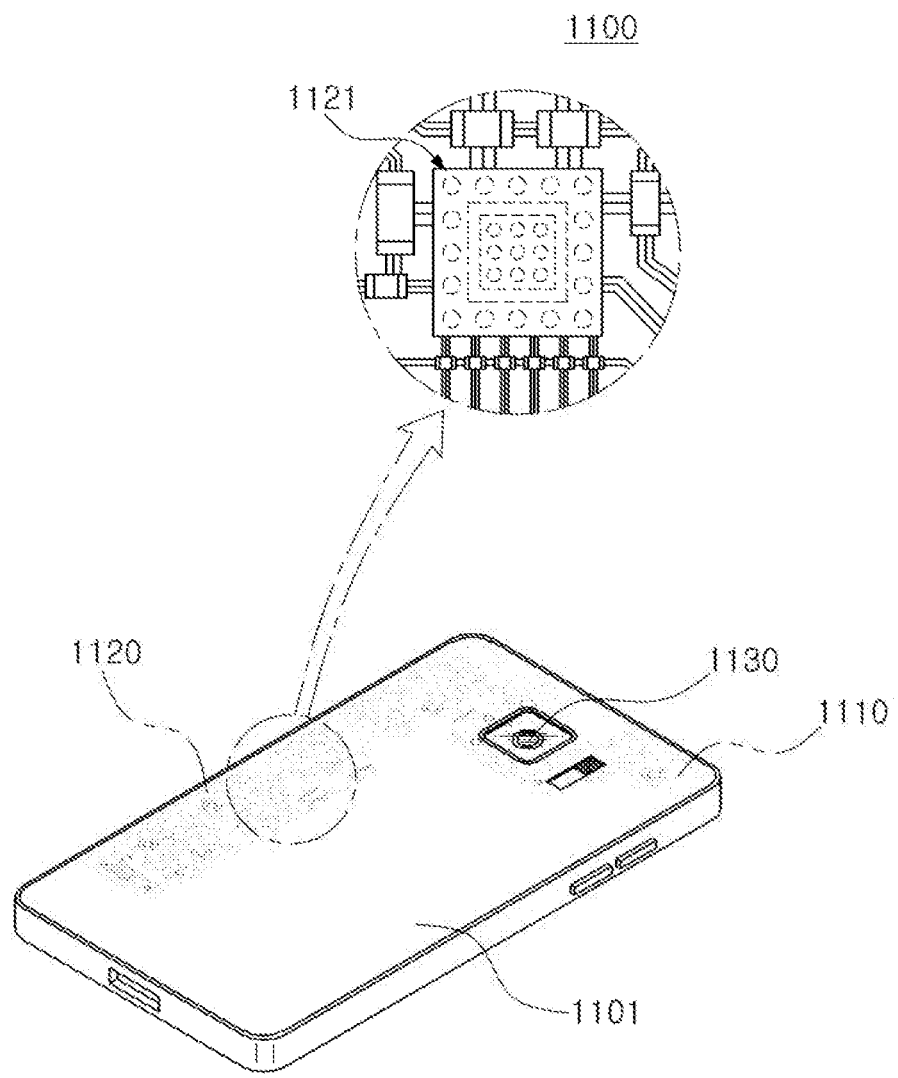
FIG. 2 is a schematic perspective diagram illustrating an example of an electronic device.

FIG. 2 is a schematic perspective diagram illustrating an example of an electronic device.

Referring to FIG. 2, a semiconductor package including an organic interposer may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the motherboard 1110, such as a camera module 1130, may be accommodated in the body 1101. Some of the electronic components 1120 may be the chip related components, and some of the components may be the interposer package 1121. The electronic device is not necessarily limited to the smartphone 1100, but may be other electronic devices as described above.

Semiconductor Package Including Interposer

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

In the description below, a semiconductor package including an interposer manufactured using the above-described packaging technology will be described in greater detail.

Figure 3:
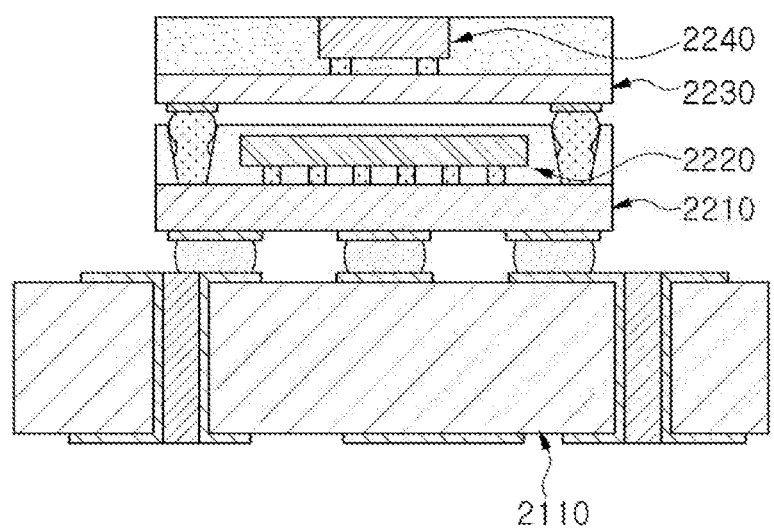
FIG. 3 is a schematic cross-sectional diagram illustrating an example in which a 3D BGA package is mounted on a mainboard of an electronic device.

FIG. 3 is a schematic cross-sectional diagram illustrating an example in which a 3D BGA package is mounted on a mainboard of an electronic device Among various types of semiconductor chips, an application specific integrated circuit (ASIC) such as graphics processing unit (GPU) may be expensive. Thus, a packaging process may need to be performed with a high yield. To this end, a ball grid array (BGA) substrate 2210 which may redistribute several thousands to several ten thousands of connection pads may be prepared before a semiconductor chip is mounted, an expensive semiconductor chip such as a GPU 2220 may be mounted on the BGA substrate 2210 subsequently using a surface mounting technology (SMT), and the like, and may be packaged, and the semiconductor chip may be mounted on a mainboard 2110.

In the GPU 2220, it may be necessary to reduce a signal path to a memory such as a high bandwidth memory (HBM), and to this end, a semiconductor chip such as a HBM 2220 may be mounted on an interposer 2230 and may be packaged, and the package may be stacked on a package on which the GPU 2220 is mounted in package-on-package (POP) form. In this case, however, a thickness of a device may significantly increase, and there may be a limitation in reducing a signal path.

Figure 4:
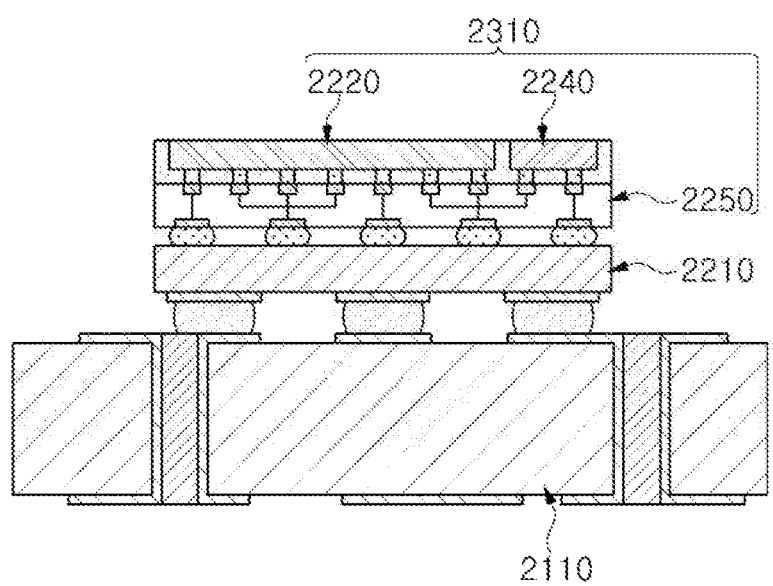
FIG. 4 is a schematic cross-sectional diagram illustrating an example in which a 2.5 D silicon interposer package is mounted on a mainboard.

FIG. 4 is a schematic cross-sectional diagram illustrating an example in which a 2.5 D silicon interposer package is mounted on a mainboard.

To address the issue described above, a semiconductor package 2310 including an organic interposer may be manufactured using a 2.5 D interposer technology in which a first semiconductor chip such as a GPU 2220 and a second semiconductor chip such as an HBM 2240 may be disposed on a surface of a silicon interposer 2250 side by side and may be packaged. In this case, the GPU 2220 having several thousands to several ten thousands of connection pads and the HBM 2240 may be redistributed through the interposer 2250, and the GPU 2220 and the HBM 2240 may be electrically connected with a significantly reduced path. The semiconductor package 2310 including the organic interposer may also be mounted on a BGA substrate 2210 again and redistributed, and may be mounted on a mainboard 2110. However, it may be difficult to form a through silicon via (TSV), and the like, in the silicon interposer 2250, and manufacturing costs may increase. Thus, there may be a difficulty in implementing a large area and reducing costs.

Figure 5:
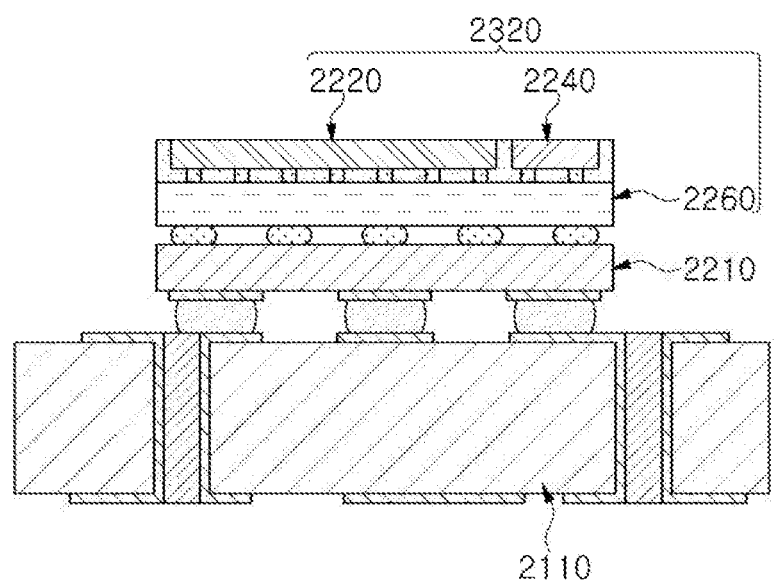
FIG. 5 is a schematic cross-sectional diagram illustrating an example in which a 2.5 D organic interposer package is mounted on a mainboard.

FIG. 5 is a schematic cross-sectional diagram illustrating an example in which a 2.5 D organic interposer package is mounted on a mainboard.

To address the issue described above, an organic interposer 2260 may be used instead of a silicon interposer 2250. For example, a semiconductor package 2320 including an organic interposer may be manufactured using a 2.5 D interposer technology in which a first semiconductor chip such as a GPU 2220 and a second semiconductor chip such as an HBM 2240 may be disposed on a surface of the organic interposer 2260 side by side and may be packaged. In this case, the GPU 2220 having several thousands to several ten thousands of connection pads and the HBM 2240 may be redistributed through the interposer 2250, and the GPU 2220 and the HBM 2240 may be electrically connected with a significantly reduced path. Also, the semiconductor package 2320 including the organic interposer may be mounted on a BGA substrate 2210, and the like, again and redistributed, and may be mounted on a mainboard 2110. The above-described configuration may also easily implement a large area and may reduce costs.

The semiconductor package 2320 including the organic interposer may be manufactured through a package process in which chips 2220 and 2240 may be mounted on the organic interposer 2260 and may be molded. The molding process may be performed because, without the molding process, the chips may not be handled and may not be connected to the BGA substrate 2210, and the like. Thus, stiffness may be maintained through the molding process. When the molding process is performed, however, due to discrepancy in coefficient of thermal expansion (CTE) between the organic interposer 2260 and the chips 2220 and 2240, and a molding material, warpage may occur, the filling of a underfill resin may be deteriorated, cracks may be created between a die and a molding material, and other problems may occur.

Figure 6:
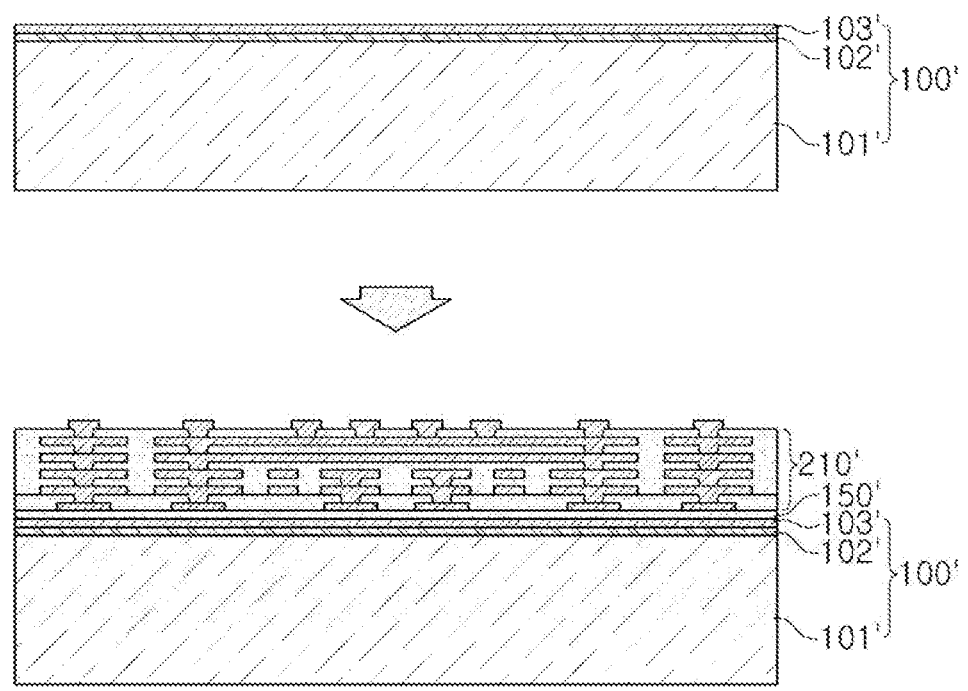
FIGS. 6 to 8 are process diagrams illustrating an example of manufacturing an organic interposer package.
Figure 7:
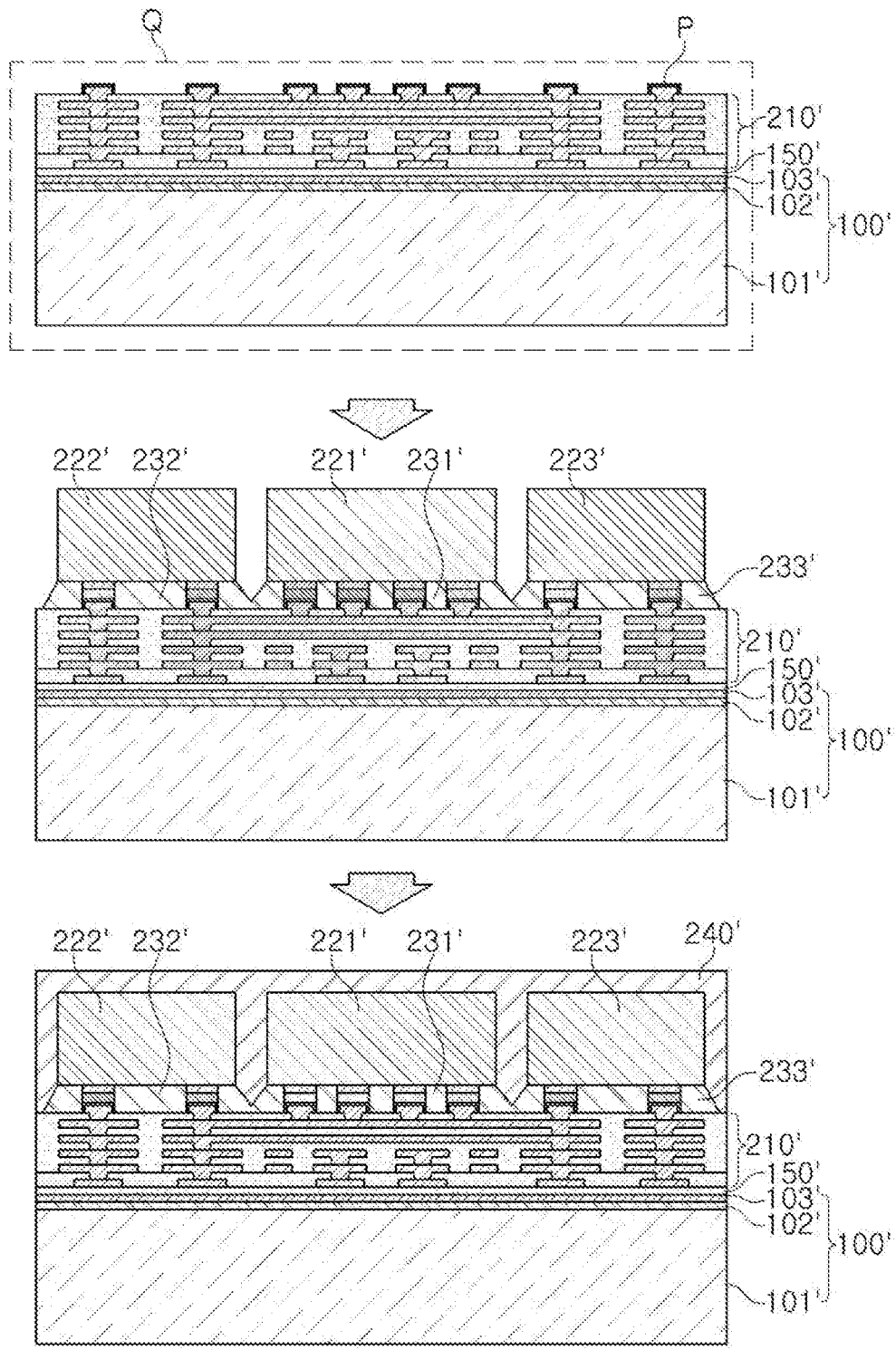
Figure 8:
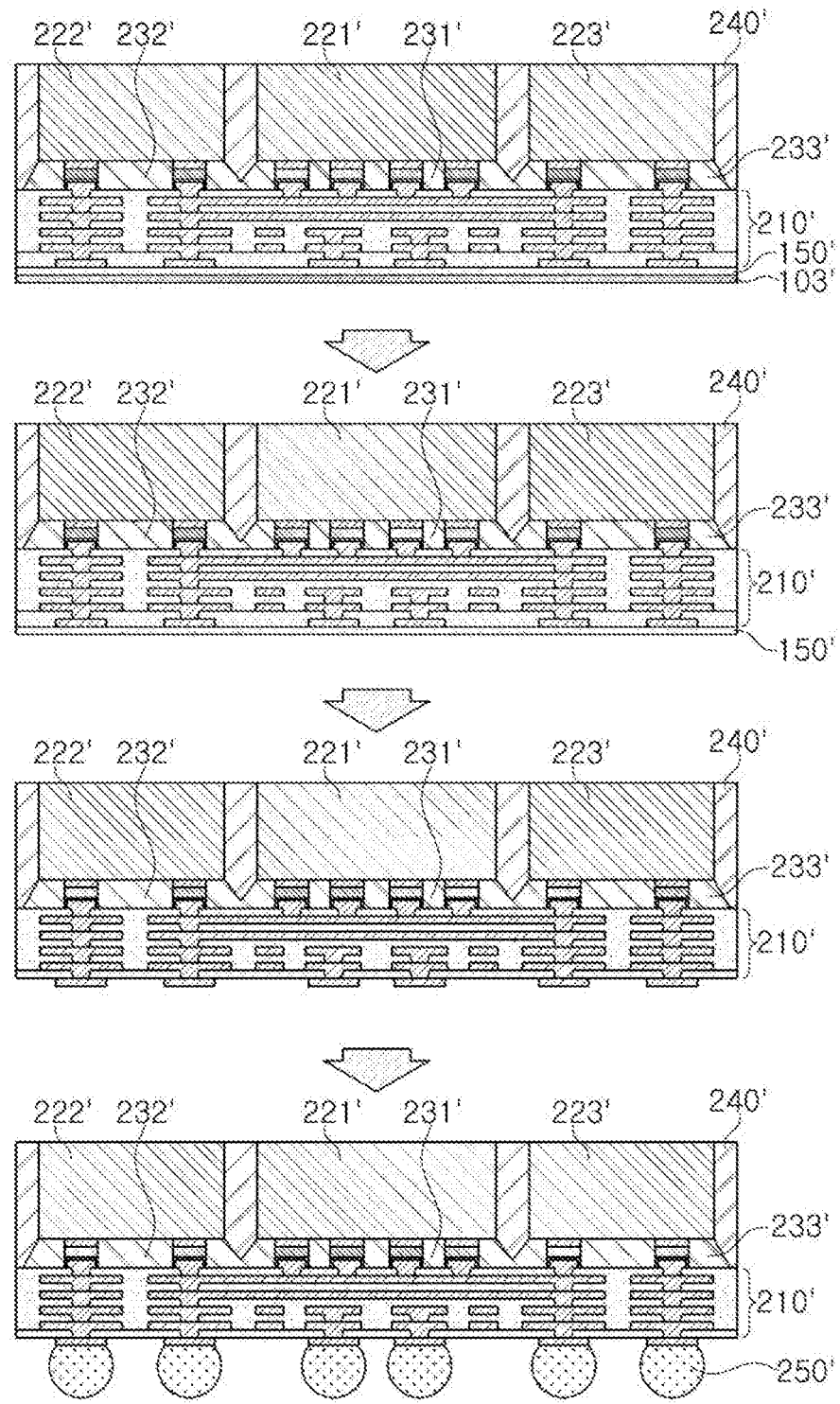

FIGS. 6 to 8 are process diagrams illustrating an example of manufacturing an organic interposer package.

Referring to FIG. 6, a carrier 100' may be prepared. The carrier 100' may include a core layer 101' and metal films 102' and 103' formed on the core layer 101'. The core layer 101' may be formed of a material including an insulating resin, an inorganic filler, and a glass fiber, such as pregreg, but a material of the core layer 101' is not limited thereto. For example, the core layer 101' may be formed of glass. The metal films 102' and 103' each may include a metal such as copper (Cu), titanium (Ti), and the like. A surface process may be performed to a region between the metal films 102' and 103' to easily separate the metal films 102' and 103'. A bonding layer (not illustrated) may also be provided in the region between the metal films 102' and 103'. An organic interposer 210' may be formed on the carrier 100'. The organic interposer 210' may be formed by forming an insulating layer such as an ABF or a PID and forming a wiring layer and a via on the insulating layer through a plating process. A wiring layer of the organic interposer 210' may be configured to be a fine circuit. If desired, a resin layer 150' may be disposed between the carrier 100' and the interposer 210'. The resin layer 150' may electrically insulate the carrier 100' and the manufactured interposer 210' from each other. The resin layer 150' may thus be used to insulate the interposer 210' from the carrier 100' when an electrical test on the wiring layer of the interposer 210' is performed. The resin layer 150' may be formed by laminating a film-type resin material, or by coating and curing a liquid resin. The resin layer 150' may be an ABF, a PID, and the like, but an example embodiment thereof is not limited thereto.

Referring to FIG. 7, a surface processing layer P may be formed on a surface of an uppermost wiring layer of the interposer 210'. Also, a quad route test, an electrical test on a wiring layer, and the like, may be performed. Although not illustrated, a panel may be sawed (Q) in quad size to obtain a plurality of quad units. During the quad sawing (Q) process, if no separation preventing design is applied to the carrier 100', the defect in which the metal films 102' and 103' are separated may occur. Thereafter, semiconductor chips 221', 222', and 223' may be mounted. When the semiconductor chips 221', 222', and 223' are mounted, a connection member such as a solder including a metal having a low melting point, such as tin (Sn), may be used. The semiconductor chips 221', 222', and 223' may be fixed using under fill resins 231', 232', and 233'. An encapsulant 240' encapsulating the semiconductor chips 221', 222', and 223' may be formed on the interposer 210'. The encapsulant 240' may be formed by laminating a film-type encapsulant material, or by coating and curing a liquid encapsulant material. Although not illustrated, after forming the encapsulant 240', a trimming process may be performed in package size to obtain a plurality of semiconductor packages.

Referring to FIG. 8, the encapsulant 240' may be ground to expose an inactive surface of each of the semiconductor chips 221', 222', and 223'. By the grinding, upper surfaces of the semiconductor chips 221', 222', and 223' may be coplanar with one another. Accordingly, thicknesses of the semiconductor chips 221', 222', and 223' may be substantially the same. The carrier 100' may be separated. The carrier 100' may be separated by separating the metal films 102' and 103', and a residual metal film 103' may be removed by an etching process. After the separating, the resin layer 150' may be removed by a grinding process if desired. An electrical interconnect structure 250' may be attached, and a reflow process, and the like, may be performed. Through the processes described above, a plurality of semiconductor packages including an organic interposer may be manufactured.

Carrier Substrate

In the description below, a carrier substrate to which a separation preventing design is applied and which may be used in the manufacturing of a package substrate including an organic interposer described in the aforementioned example embodiment will be described in greater detail.

Figure 9:
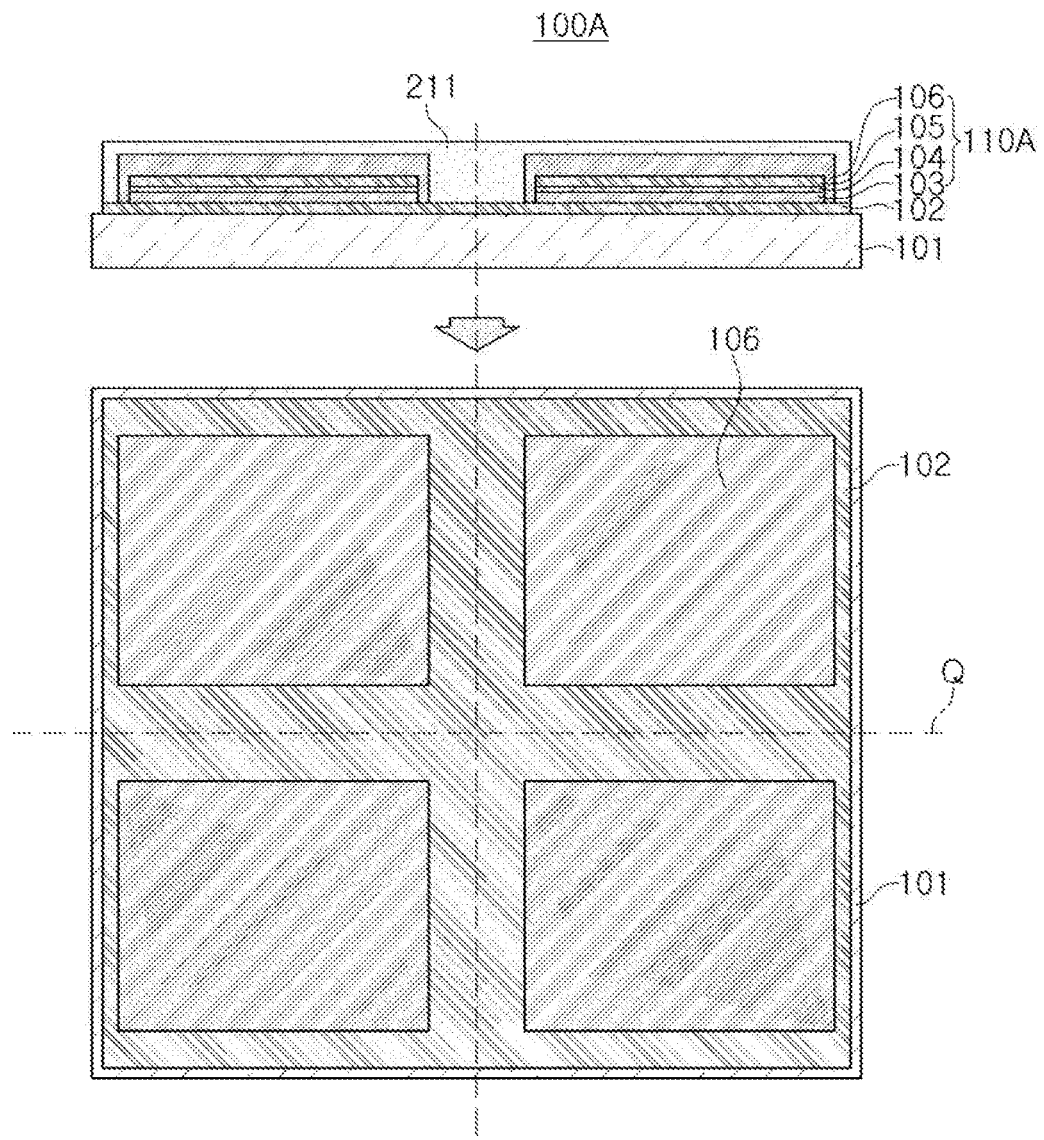
FIG. 9 is a schematic cross-sectional diagram and a schematic plan diagram illustrating an example of a carrier substrate.

FIG. 9 is a schematic cross-sectional diagram and a schematic plan diagram illustrating an example of a carrier substrate.

In the plan diagram, an insulating layer 211 is not illustrated.

Referring to the diagram, a carrier substrate 100A may include a core layer 101, a base metal layer 102 disposed on the core layer 101, and a unit pattern portion 110A disposed on the base metal layer 102. The unit pattern portion 110A may include a first metal layer 103, a release layer 104 disposed on the first metal layer 103, a second metal layer 105 disposed on the release layer 104, and a third metal layer 106 disposed on the second metal layer 105 and covering side surfaces of the release layer 104. The number of the unit pattern portions 110A may not be limited to any particular number, and a patterned shape may also be different from the example illustrated in the diagram. Each of the unit pattern portions 110A may have an area smaller than areas of the core layer 101 and the base metal layer 102, and the unit pattern portions 110A may be patterned to be physically spaced apart from each other by a certain distance. As a separation preventing design is applied to the carrier substrate 100A by using the unit pattern portion 110A in the example embodiment, even when a sawing process (Q) is performed by quad or strip unit, the release layer 104 may be prevented from being separated from the first metal layer 103 and/or the second metal layer 105. When a semiconductor package is implemented using the carrier substrate 100A, however, the release layer 104 may be abnormally separated, but in the example embodiment, side surfaces of the release layer 104 may be covered by the third metal layer 106 in the carrier substrate 100A, and the above-described issue may be prevented.

In the description below, the elements included in the carrier substrate 100A will be described in greater detail.

The core layer 101 may be formed of a material having better flatness than flatness of pregreg. For example, the core layer 101 may be a glass plate. A glass plate has excellent flatness compared to pregreg. A glass plate may refer to an amorphous solid material including a glass component. A glass plate may refer to a material having high transparency, which may be created by melting silica, sodium carbonate, calcium carbonate, and the like, at high temperature and cooling the material, and a glass plate may be different from an insulating material including an insulating resin with a glass fiber or an inorganic filler. The glass included in the glass plate may be silicate glass such as sodium lime glass, potassium lime glass, lead glass, barium glass, silicic acid glass, and the like, borosilicate glass such as pyrex, alumina glass, and the like, or phosphate glass, but an example of the glass is not limited thereto. For example, the glass may include a silicate component. Silicate may be formed by mixture of silica ($SiO_2$) with boron oxide, sodium oxide, aluminium oxide, barium oxide, lithium oxide, calcium oxide, zirconium oxide, and the like. In the example embodiment, the glass plate may include a silicate component in which at least one or more metal oxides among boron oxide ($B_2O_3$), sodium oxide ($Na_2O$), aluminium oxide ($Al_2O_3$), barium oxide (BaO), lithium oxide ($Li_2O$), calcium oxide (CaO), and zirconium oxide ($ZrO_2$) is mixed with silica ($SiO_2$), but a material of the glass plate is not limited thereto. A thickness of the core layer 101 may be approximately 0.8 mm to 1.2 mm.

The base metal layer 102 may be disposed between the core layer 101 and the unit pattern portion 110A, and may occupy a greater area than an area of the unit pattern portion 110A on the core layer 101. The base metal layer 102 may be a sputter metal. The base metal layer 102 may include a titanium (Ti) component, and may be a Ti layer. However, an example embodiment thereof is not limited thereto, and the base metal layer 102 may be a well-known metal layer having a characteristic similar to that of the titanium (Ti) layer, or may further include another metal layer with a similar characteristic. The base metal layer 102 may have a thickness of approximately 0.08 μm to 0.12 μm. In the example embodiment, a portion of an upper surface of the base metal layer 102 may not be covered by the unit pattern portion 110A but may be exposed. Accordingly, when the insulating layer 211 is additionally formed on the carrier substrate 100A, the insulating layer 211 may be in contact with the base metal layer 102 and cover the base metal layer 102, rather than being in contact with the core layer 101, and adhesive strength therebetween may improve such that a delamination issue may be resolved. In this case, as described above, when the base metal layer 102 is implemented as a Ti layer, the Ti layer may have improved adhesive strength with a photosensitive insulating material (PID) as compared to a glass plate or a copper (Cu) layer, and thus, a delamination issue may be effectively resolved.

As illustrated in the diagram, the base metal layer 102 may have an area smaller than an area of the core layer 101. Thus, outer regions of the core layer 101, edges of an upper surface and side surfaces, for example, may be exposed from the base metal layer 102. Thus, when the metal layer on the outer region of the core layer 101 is removed, an arc defect which may occur during a sputter process may be prevented.

The first metal layer 103 may be a sputter metal. The first metal layer 103 may include a copper (Cu) component, and may be a Cu layer. However, an example embodiment thereof is not limited thereto. The first metal layer 103 may be a well-known metal layer having a characteristic similar to that of the copper (Cu) layer, or may further include another metal layer with a similar characteristic. The first metal layer 103 may have a thickness of approximately 0.08 μm to 0.12 μm.

The release layer 104 may be formed of a material having a stable detachable characteristic, such as a carbon material, for example, but a material of the release layer 104 is not limited thereto. The carrier substrate 100A may be separated from the organic interposer by detaching the release layer 104, rather than etching and removing the release layer 104, and accordingly, the release layer 104 may be formed of a material that does not melt by an etchant. Also, in the example embodiment, as a separation preventing design is applied to the carrier substrate 100A by using the unit pattern portion 110A as described above, the release layer 104 may be prevented from being separated during a sawing process performed by quad or strip unit. A thickness of the release layer 104 may be less than thicknesses of the other layers 101, 102, 103, 105, and 106. For example, a thickness of the release layer 104 may be 0.002 μm to 0.004 μm.

In the example embodiment, the release layer 104 and the first metal layer 103 may have the same width, and side surfaces of the release layer 104 and the first metal layer 103 may be covered by the third metal layer 106. The configuration may be employed to effectively seal the release layer 104 using the first metal layer 103 and the third metal layer 106.

The second metal layer 105 may also be a sputter metal. The second metal layer 105 may include a titanium (Ti) component, and may be a Ti layer. However, an example embodiment thereof is not limited thereto, and the base metal layer 102 may be a well-known metal layer having a characteristic similar to that of the titanium (Ti) layer, or may further include another metal layer with a similar characteristic. The second metal layer 105 may have a thickness of approximately 0.08 μm to 0.12 μm. As illustrated in the diagram, the second metal layer 105 may have the same width as a width of the release layer 104, and side surfaces of the second metal layer 105 may be covered by the third metal layer 106. Thus, the second metal layer 105 may be sealed by the first metal layer 103 and the third metal layer 106 along with the release layer 104.

The third metal layer 106 may also be a sputter metal. The third metal layer 106 may include a copper (Cu) component, and may be a Cu layer. However, an example embodiment thereof is not limited thereto. The third metal layer 106 may be a well-known metal layer having a characteristic similar to that of the copper (Cu) layer, or may further include another metal layer with a similar characteristic. The third metal layer 106 may have a thickness of approximately 0.28 μm to 0.32 μm. Thus, to effectively secure detaching properties and flatness, a thickness of the copper (Cu) layer of the third metal layer 106 may be greater than a thickness of the first metal layer 103.

In the example embodiment, the third metal layer 106 may be disposed on the second metal layer 105, and may cover side surfaces of the release layer 104 and the second metal layer 105. A region of the third metal layer 106 covering the side surfaces of the release layer 104 and the second metal layer 105 may be in contact with side surfaces of the first metal layer 103, and accordingly, the release layer 104 and the second metal layer 105 may be sealed by the first metal layer 103 and the third metal layer 106. To this end, the first metal layer 103, the release layer 104, and the second metal layer 105 may have the same width.

The first metal layer 103 and the third metal layer 106 may be formed of the same material, formed of Cu, for example. The first metal layer 103 and the third metal layer 106 may be implemented by different processes, a discontinuous interfacial surface may be formed between the first metal layer 103 and the third metal layer 106. In the carrier substrate 100A in the example embodiment, the release layer 104 may be effectively protected from external impacts by the metal layers 103 and 106 surrounding the release layer 104. Thus, in a subsequent process for manufacturing a semiconductor package, the release layer 104 may be stably combined with an organic interposer or the core layer 101, and the like, and the likelihood of abnormal separation may decrease.

The insulating layer 211 may be an additional element of the carrier substrate 100A, and may be used as a base insulating layer when an interposer 210 is formed using the carrier substrate 100A. The insulating layer 211 may include an insulating material, and may include a photosensitive insulating material (PID) in particular. The insulating layer 211 may be disposed on the base metal layer 102 and may cover a plurality of the unit pattern portions 110A, and may be physically in contact with the base metal layer 102 and the unit pattern portion 110A, but may not be in contact with the core layer 101.

Figure 10:
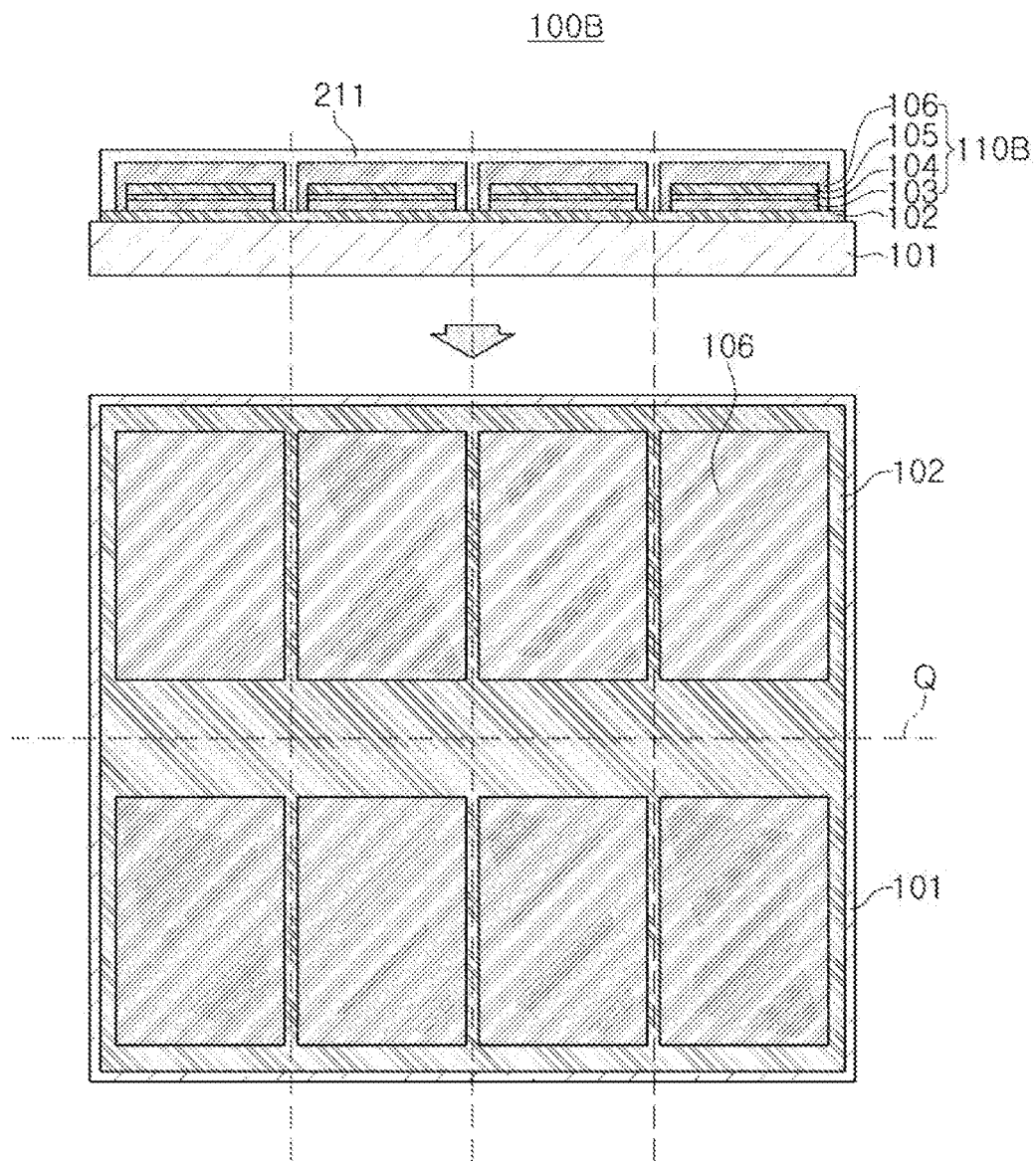
FIG. 10 is a schematic cross-sectional diagram and a schematic plan diagram illustrating another example of a carrier substrate.

FIG. 10 is a schematic cross-sectional diagram and a schematic plan diagram illustrating another example of a carrier substrate. In the plan diagram, an insulating layer 211 is not illustrated.

Referring to the diagrams, in a carrier substrate 100B in the example embodiment, a unit pattern portion 110B may be formed by strip unit, as compared to the carrier substrate 100A described in the aforementioned example embodiment. The descriptions of the other elements are the same as the descriptions described in the aforementioned example embodiments. As a separation preventing design is also applied to the carrier substrate 100B in the example embodiment by using the unit pattern portion 110B, even when a sawing process (Q) is performed by quad or strip unit, the release layer 104 may be prevented from being separated from the first metal layer 103 and/or the second metal layer 105. Also, the release layer 104 may be effectively protected from external impacts by the metal layers 103 and 106 surrounding the release layer 104. Thus, in a subsequent process for manufacturing a semiconductor package, the release layer 104 may be stably combined with an organic interposer or the core layer 101, and the like, and the likelihood of abnormal separation may decrease.

Figure 11:
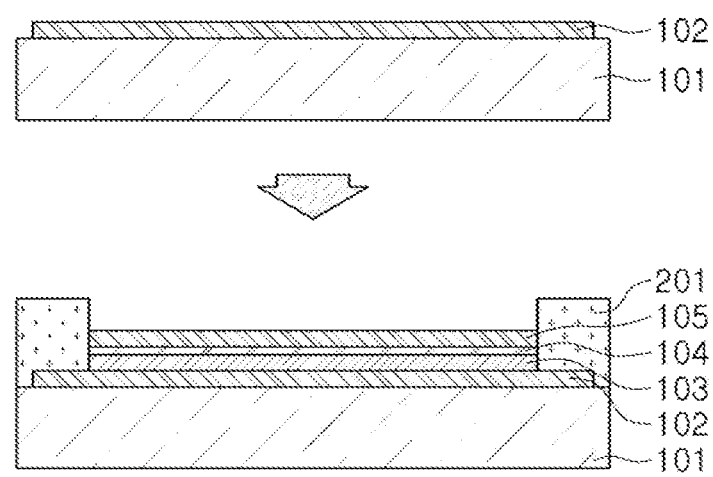
FIGS. 11 and 12 are schematic cross-sectional diagrams illustrating an example of manufacturing a carrier substrate.
Figure 12:
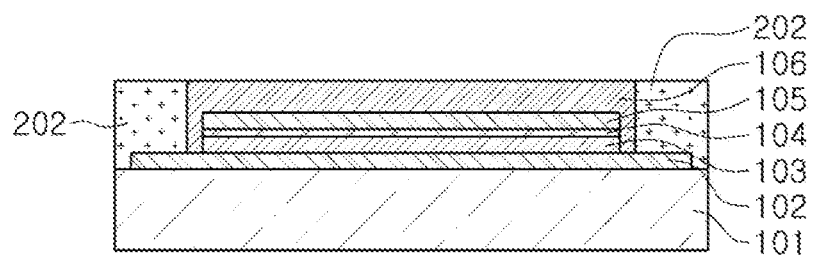

FIGS. 11 and 12 are schematic cross-sectional diagrams illustrating an example of manufacturing a carrier substrate.

Referring to FIG. 11, a base metal layer 102 may be formed on a core layer 101 using a sputtering process, and the like, the base metal layer 102 may occupy a smaller area than an area of the core layer 101, and a portion of an upper surface of the core layer 101 may be exposed. To expose a portion of the core layer 101, a method of forming the base metal layer 102 using a mask, a method of forming the base metal layer 102 on an overall upper surface of the core layer 101 and removing a portion of the base metal layer 102, or the like, may be used. Thereafter, a first metal layer 103, a release layer 104, and a second metal layer 105 may be formed in order, and a first mask 201 having an open region may be used. A material of the first mask 201 may not be limited to any particular material as long as an open region for forming the metal layers is able to be formed. For example, the first mask 201 may be a metal mask. As the first metal layer 103, the release layer 104, and the second metal layer 105 are formed in order using the same mask 201, the first metal layer 103, the release layer 104, and the second metal layer 105 may have the same width, and side surfaces of the first metal layer 103, the release layer 104, and the second metal layer 105 may be coplanar with one another.

As illustrated in FIG. 12, the first mask 201 may be removed, and a second mask 202 having a width greater than a width of the first mask 201 may be formed. A third metal layer 106 may be formed using the second mask 202, and may be formed using a sputtering process. The third metal layer 106 may be disposed on an upper portion of the second metal layer 105, and may seal the first metal layer 103, the release layer 104, and the second metal layer 105. By the sealing structure described above, the release layer 104, especially edge portions of the release layer 104 may be effectively protected, and the combined state may be maintained stably during subsequent processes. As for a thickness of the third metal layer 106, in FIG. 12, a thickness of a region formed in an upper portion of the second metal layer 105 is greater than a thickness of a region covering side surfaces of the release layer 104, but the thicknesses are not limited to the example but may vary. The above-described regions may have the same thickness.

After forming the third metal layer 106, the insulating layer 211 covering the unit pattern portions 110A or 110B may be formed on the base metal layer 102 by coating or laminating a photosensitive insulating material (PID).

Figure 13:
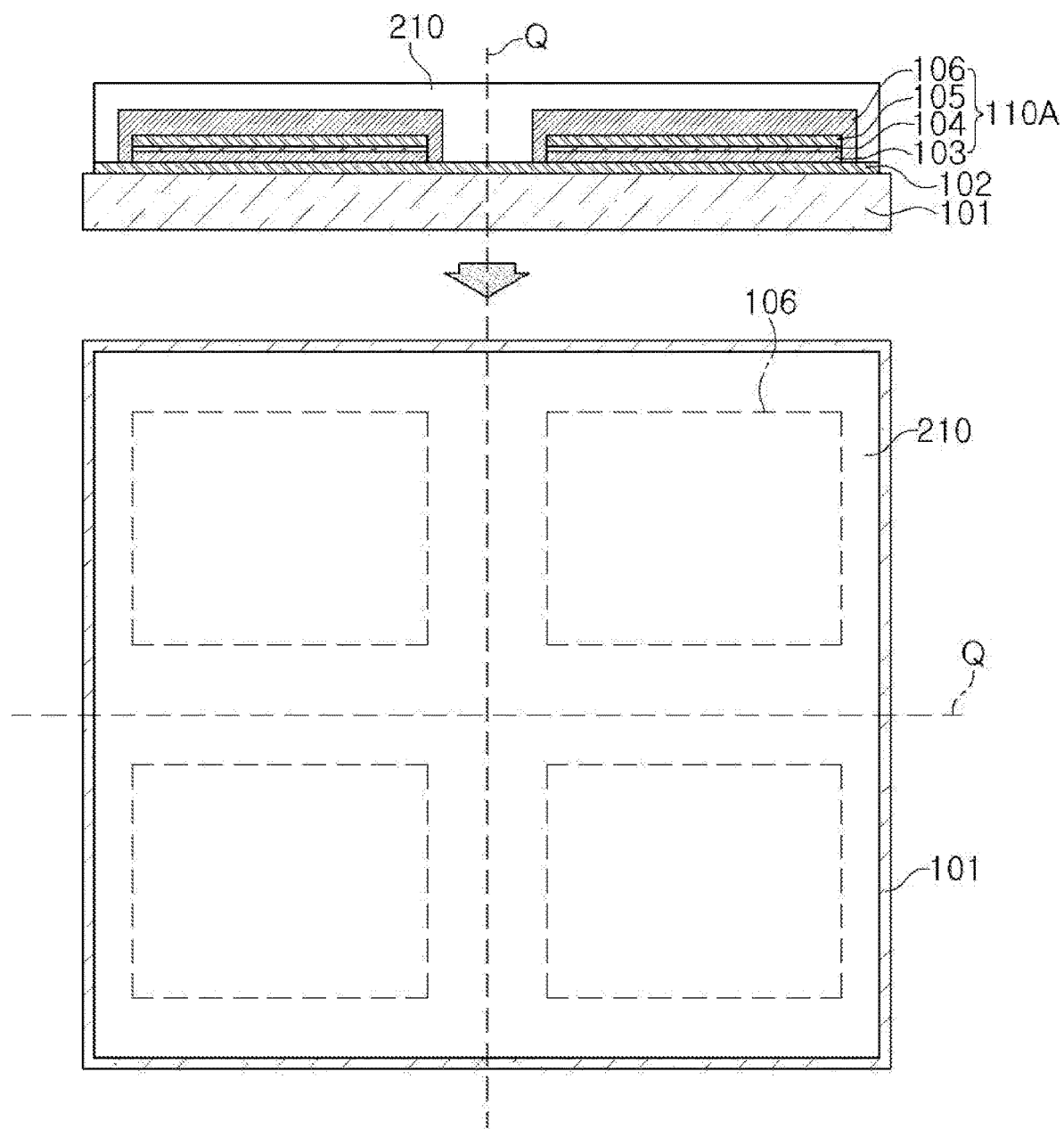
FIGS. 13 and 14 are process diagrams illustrating an example of manufacturing a semiconductor package using a carrier substrate.
Figure 14:
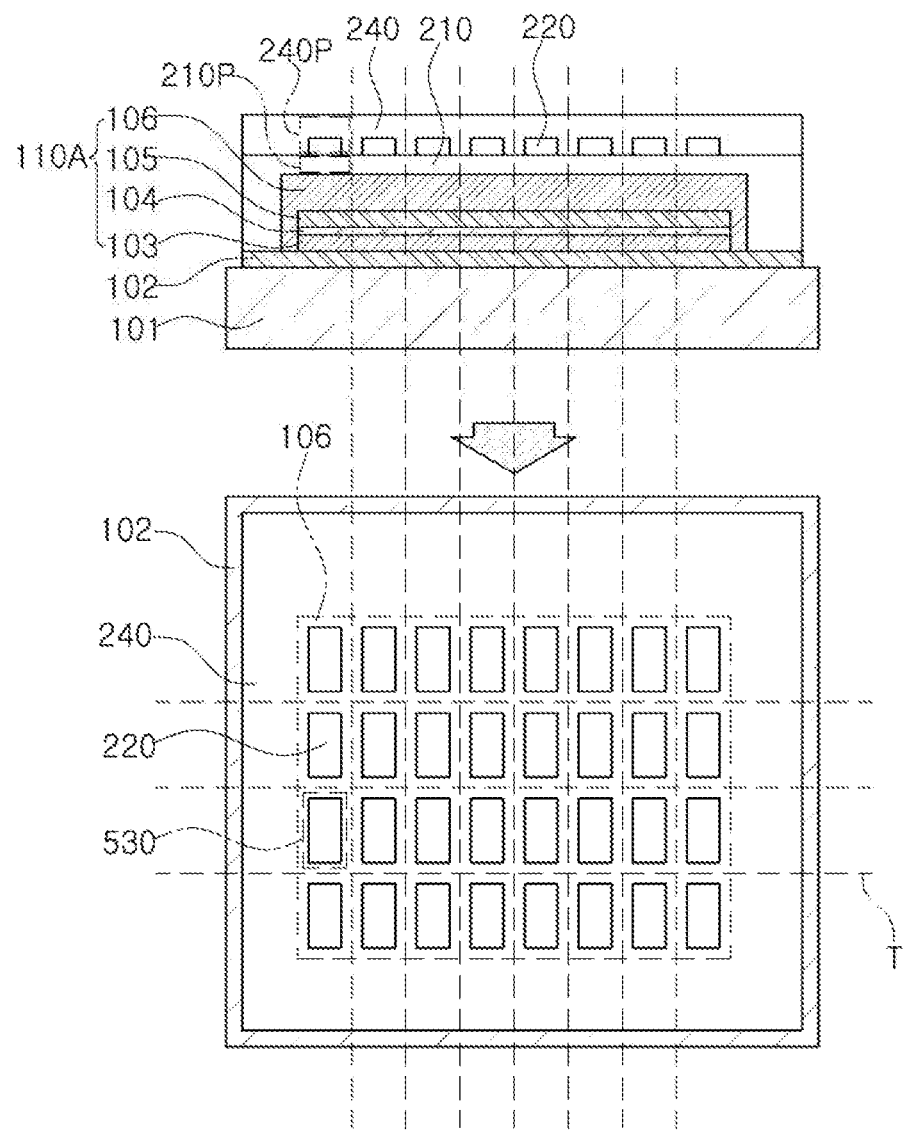

FIGS. 13 and 14 are process diagrams illustrating an example of manufacturing a semiconductor package using a carrier substrate.

Referring to FIG. 13, a carrier substrate 100A including a unit pattern portion 110A described in the aforementioned example embodiment may be prepared. Alternatively, a carrier substrate 100B described in another example embodiment may also be used. In the plan diagram, an insulating layer 211 is not illustrated. An interposer 210 including an insulating layer, a wiring layer, and via may be formed on each of the unit pattern portions 110A. In this case, the insulating layer 211 included in the carrier substrate 100A may be used as a base insulating layer of the interposer 210. After forming the interposer 210, an electrical test may be performed on the wiring layer. A sawing process (Q) for cutting the carrier substrate of a panel size into a quad or strip size may be performed. The sawing process (Q) may be performed by cutting the carrier substrate 100A and the interposer 210 such that the unit pattern portions 110A may be isolated from each other. As described above, as a separation preventing design is applied to the carrier substrate 100A, separation of the carrier substrate 100A may be prevented during the sawing process (Q). Also, due to the sealing structure described above, the release layer 104 may be effectively protected from external impacts such as infiltration of an etchant during the process of manufacturing the interposer 210.

As illustrated in FIG. 14, a plurality of semiconductor chips 220 may be disposed on the interposer 210 on each of the isolated unit pattern portions 110A. An encapsulant 240 for encapsulating the plurality of semiconductor chips 220 may be formed on the interposer 210 on each of the isolated unit pattern portions 110A, and a plurality of semiconductor packages 530 including an interposer portion 210P, one or more semiconductor chips 220 disposed on the interposer portion 210P, and an encapsulating portion 240P encapsulating the one or more semiconductor chips 220 may be manufactured on each of the isolated unit pattern portions 110A. The isolated unit pattern portions 110A may be trimmed such that the plurality of semiconductor packages 530 on each of the isolated unit pattern portions 110A may be isolated from each other. In the diagram, each of the plurality of semiconductor packages 530 manufactured after the trimming (T) includes a single semiconductor chip 220, but each of the plurality of semiconductor packages 530 may also include a plurality of semiconductor chips 220. The carrier substrate 100A to which the sawing process (Q) and the trimming process (T) are performed may be separated from each of the isolated semiconductor packages 530, the plurality of semiconductor packages 530 may be obtained. In the process of separating the sawed and trimmed carrier substrate 100A, the release layer 104 of each of the sawed and trimmed unit pattern portions 110A may be separated from the first metal layer 103, or the release layer 104 may be separated from the second metal layer 105. After the separation, the second and third metal layers 105 and 106 remaining in each of the semiconductor packages 530 may be removed by an etching process if desired.

According to the aforementioned example embodiments, a carrier substrate in which a stable process operation may be secured without separating a carrier during a quad-level assembly process, and which may resolve the delamination of an interfacial surface between a carrier and an insulating layer may be provided. Also, a method of manufacturing a semiconductor package including an interposer having a fine circuit using the carrier substrate may be provided.

In the example embodiments, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The terms may be defined as above for ease of description, and the scope of right of the example embodiments is not particularly limited to the above terms.

In the example embodiments, the term "area" may refer to a wideness or a size of an upper surface or a lower surface of an element adjacent to other elements with reference to the attached drawings.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While the example embodiments have been shown and described above, it will be apparent to those skilled in the art that modifications and variations could be made without departing from the scope of the present invention as defined by the appended claims.

What is claimed is:

1. A carrier substrate, comprising:
a core layer; and
at least one unit pattern portion,
wherein the unit pattern portion includes a first metal layer disposed on the core layer, a release layer disposed on the first metal layer, and a third metal layer disposed on the release layer and covering side surfaces of the release layer.

2. The carrier substrate of claim 1, further comprising:
a base metal layer disposed between the core layer and the unit pattern portion, and having an area larger than an area of the unit pattern portion on the core layer.

3. The carrier substrate of claim 2, wherein the base metal layer includes a Ti component.

4. The carrier substrate of claim 1, wherein the first metal layer includes a Cu component.

5. The carrier substrate of claim 1, wherein the third metal layer includes a Cu component.

6. The carrier substrate of claim 1, wherein the first metal layer and the release layer have the same width.

7. The carrier substrate of claim 1, wherein a region of the third metal layer covering the side surfaces of the release layer is in contact with side surfaces of the first metal layer.

8. The carrier substrate of claim 1, wherein the release layer is sealed by the first and third metal layers.

9. The carrier substrate of claim 1, further comprising a second metal layer disposed on the release layer such that the release film is disposed between the first metal layer and the second metal layer.

10. The carrier substrate of claim 9, wherein the second metal layer includes a Ti component.

11. The carrier substrate of claim 9, wherein the first metal layer, the release layer, and the second metal layer have the same width.

12. The carrier substrate of claim 11, wherein side surfaces of the second metal layer are covered by the third metal layer.

13. The carrier substrate of claim 12, wherein a region of the third metal layer covering the side surfaces of the release layer and side surfaces of the second metal layer is in contact with side surfaces of the first metal layer.

14. The carrier substrate of claim 13, wherein the release layer and the second metal layer are sealed by the first and third metal layers.

15. The carrier substrate of claim 1, wherein the core layer is a glass plate.

* * * * *